US010199336B2

(12) United States Patent
Hsu et al.

(10) Patent No.: US 10,199,336 B2
(45) Date of Patent: Feb. 5, 2019

(54) ANTENNA PACKAGE DEVICE

(71) Applicant: Advanced Semiconductor Engineering, Inc., Kaohsiung (TW)

(72) Inventors: Shao-En Hsu, Kaohsiung (TW); Huei-Shyong Cho, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/604,545

(22) Filed: May 24, 2017

(65) Prior Publication Data

US 2018/0342471 A1 Nov. 29, 2018

(51) Int. Cl.
*H01L 23/66* (2006.01)
*H01L 23/498* (2006.01)
*H01L 23/31* (2006.01)
*H01P 3/08* (2006.01)
*H01Q 1/22* (2006.01)
*H01Q 13/08* (2006.01)

(52) U.S. Cl.
CPC .......... *H01L 23/66* (2013.01); *H01L 23/3121* (2013.01); *H01L 23/49838* (2013.01); *H01P 3/08* (2013.01); *H01Q 1/2283* (2013.01); *H01Q 13/08* (2013.01); *H01L 2223/6616* (2013.01); *H01L 2223/6627* (2013.01); *H01L 2223/6677* (2013.01)

(58) Field of Classification Search
CPC ............... H01L 23/66; H01L 23/3132; H01L 23/49838; H01L 22/83; H01L 2223/6627; H01L 2223/6616; H01L 2223/6677; H01P 3/08; H01Q 1/2283; H01Q 13/08
USPC ......................... 257/664, 728, 723, 724, 685
See application file for complete search history.

(56) References Cited

U.S. PATENT DOCUMENTS

| 4,751,513 | A | * | 6/1988 | Daryoush | ............... | H01Q 1/247 |
| | | | | | | 343/700 MS |
| 5,886,670 | A | * | 3/1999 | Manasson | ............ | H01Q 3/2676 |
| | | | | | | 333/248 |
| 6,293,688 | B1 | * | 9/2001 | Deacon | ................ | G02B 6/1228 |
| | | | | | | 362/551 |
| 6,515,562 | B1 | * | 2/2003 | Takenoshita | ............ | H01P 3/121 |
| | | | | | | 333/248 |
| 2012/0119969 | A1 | * | 5/2012 | MacDonald | .......... | H01L 23/552 |
| | | | | | | 343/841 |
| 2014/0239465 | A1 | | 8/2014 | Yen et al. | | |
| 2014/0240187 | A1 | * | 8/2014 | Herbsommer | ............ | H01P 3/16 |
| | | | | | | 343/785 |

(Continued)

*Primary Examiner* — Alexander Oscar Williams
(74) *Attorney, Agent, or Firm* — Foley & Lardner LLP; Cliff Z. Liu

(57) ABSTRACT

An antenna semiconductor package device includes a first conductive layer, a second conductive layer, a first conductive element and a first directing element. The second conductive layer is over the first conductive layer and separated from the first conductive layer. The first conductive element connects the first conductive layer to the second conductive layer. The first directing element is adjacent to the first conductive layer and separated from the first conductive layer by a first gap. The first conductive element, the first conductive layer and the second conductive layer define a waveguide cavity and a radiation opening.

22 Claims, 10 Drawing Sheets

(56) References Cited

U.S. PATENT DOCUMENTS

| | | | | |
|---|---|---|---|---|
| 2015/0301275 | A1* | 10/2015 | Andle | G02B 6/293 |
| | | | | 385/43 |
| 2016/0043455 | A1* | 2/2016 | Seler | H01P 11/002 |
| | | | | 333/26 |
| 2017/0187094 | A1* | 6/2017 | Cook | H01Q 1/2283 |
| 2017/0213800 | A1* | 7/2017 | Seler | H01L 23/66 |
| 2017/0324135 | A1* | 11/2017 | Blech | H01P 5/107 |

* cited by examiner

ANTENNA PACKAGE DEVICE

BACKGROUND

1. Technical Field

The present disclosure relates to a semiconductor package device, and more particularly, to a semiconductor package device including an antenna array.

2. Description of the Related Art

Wireless communication devices, such as cell phones, vehicle radars, can include antennas for transmitting and receiving radio frequency (RF) signals. In some applications, the size of the antenna, transmission quality and the transmission distance are important parameters for designing an antenna. Some wireless communication devices include an antenna and a communication module, each disposed on different parts of a circuit board. Under some approaches, the antenna and the communication module are separately manufactured and electrically connected together after being placed on the circuit board. Accordingly, separate manufacturing costs may be incurred for both components. Furthermore, it may be difficult to reduce a size of a wireless communication device to attain a suitably compact product design. Therefore, it is desirable to develop an antenna that can be integrated into a semiconductor package device and has a higher gain.

SUMMARY

In some aspects according to some embodiments, an antenna semiconductor package device includes a first conductive layer, a second conductive layer, a first conductive element and a first directing element. The second conductive layer is over the first conductive layer and separated from the first conductive layer. The first conductive element connects the first conductive layer to the second conductive layer. The first directing element is adjacent to the first conductive layer and separated from the first conductive layer by a first gap. The first conductive element, the first conductive layer and the second conductive layer define a waveguide cavity and a radiation opening.

Figure 1A:
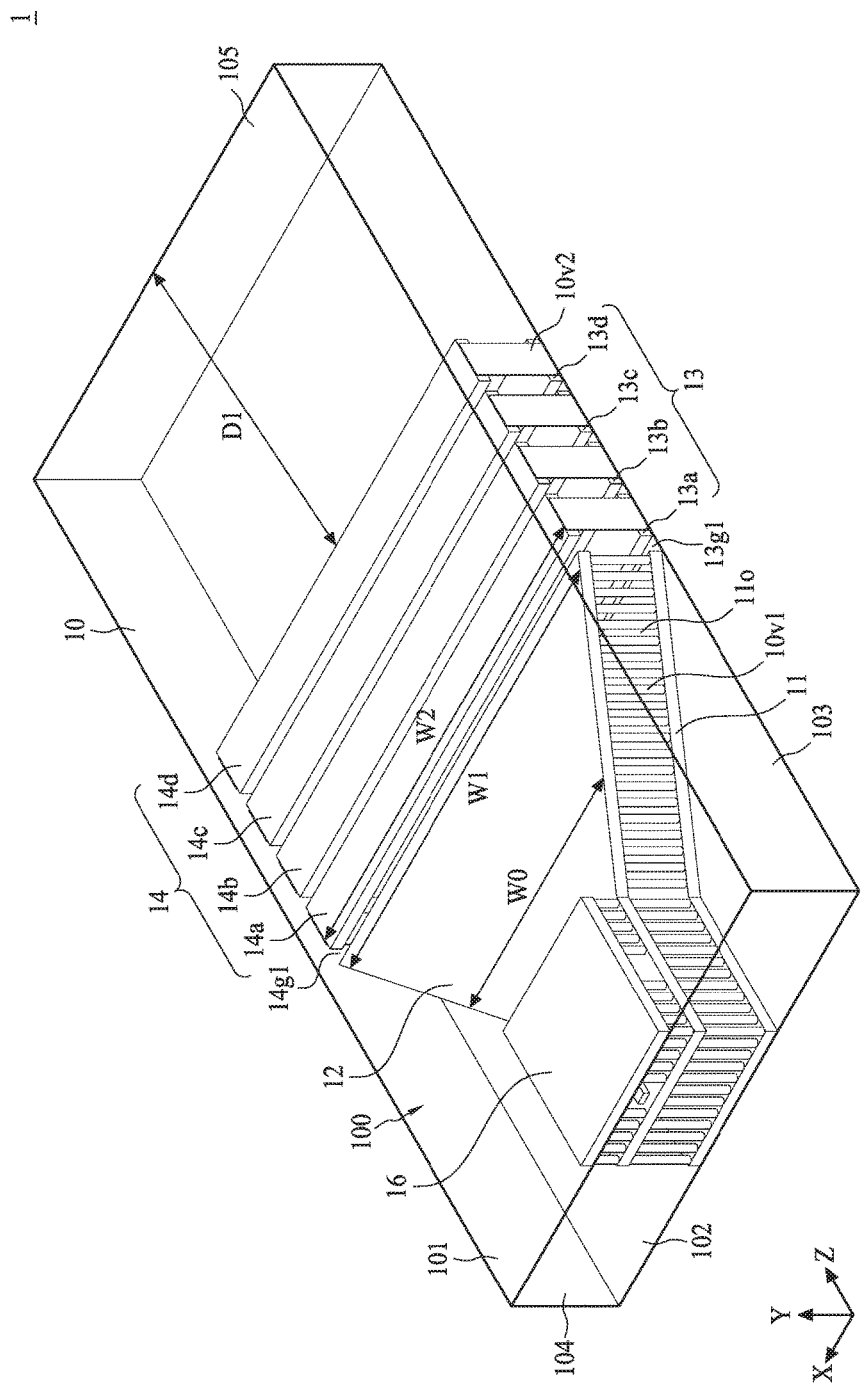
FIG. 1A illustrates a perspective view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a perspective view of a semiconductor package device 1 in accordance with some embodiments of the present disclosure. The semiconductor package device 1 includes a substrate 10, conductive layers 11, 12, 16, and directors 13, 14.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure (or electrical connection), such as a redistribution layer (RDL) or a grounding element. The substrate has a surface 101 and a surface 102 opposite to the surface 101. In some embodiments, the surface 101 of the substrate 10 is referred to as a top surface or a first surface and the surface 102 of the substrate 10 is referred to as a bottom surface or a second surface. The substrate 10 further has lateral surfaces 103, 104 (e.g., first lateral surfaces) and 105 (e.g., second lateral surface). The lateral surface 103 extends between the top surface 101 and the bottom surface 102. The lateral surface 104 extends between the top surface 101 and the bottom surface 102 and is opposite to the lateral surface 103. The lateral surface 105 extends between the top surface 101 and the bottom surface 102 and is adjacent to both the lateral surfaces 103 and 104. In some embodiments, the substrate 10 may include multiple layers (e.g., metal layers), in which the layers can be electrically connected through interconnection structures (e.g., vias).

The conductive layer (or "the first conductive layer") 11 is disposed at a first layer of the substrate 10. For example, the conductive layer 11 is disposed within the substrate 10 and adjacent to the bottom surface 102 of the substrate 10. In some embodiments, the conductive layer 11 can be disposed on the bottom surface 102 of the substrate 10. In some embodiments, the conductive layer 11 includes, for example, gold (Au), silver (Ag), aluminum (Al), copper (Cu), or an alloy thereof.

The conductive layer (or "the second conductive layer") 12 is disposed over the conductive layer 11 and separated from the conductive layer 11. The conductive layer 12 is disposed at a location corresponding to the conductive layer 11. The conductive layer 12 is disposed at a second layer of the substrate 10 that is separated from the first layer of the substrate 10. For example, the conductive layer 12 is disposed within the substrate 10 and adjacent to the top surface 101 of the substrate 10. In some embodiments, the conductive layer 12 can be disposed on the top surface 101 of the substrate 10. In some embodiments, the conductive layer 12 includes, for example, Au, Ag, Al, Cu, or an alloy thereof.

The conductive layers 11 and 12 can be electrically connected to each other through one or more conductive elements (e.g., one or more first conductive elements) 10v1. In some embodiments, the conductive elements 10v1 may include conductive pillars or vias disposed along the edges of the conductive layers 11 and 12 and electrically connecting the conductive layer 11 with the conductive layer 12. There may be a gap between any two of the conductive pillars or vias. In some embodiments, the conductive elements 10v1 may include a metal plate disposed along the edges of the conductive layers 11 and 12 and electrically connecting the conductive layer 11 with the conductive layer 12. In some embodiments, the conductive elements 10v1 may be disposed at any locations between the conductive layers 11 and 12 and electrically connect the conductive layer 11 with the conductive layer 12.

In some embodiments, a width of the conductive layers 11 and 12 gradually increases along a direction toward the lateral surface 105 of the substrate 10. For example, a width W1 of the conductive layers 11 and 12 is greater than a width W0 of the conductive layers 11 and 12 that is further from the lateral surface 105. In some embodiments, the conductive layers 11, 12 and the conductive elements 10v1 define a horn-shaped structure with a waveguide cavity. In some embodiments, the conductive layers 11, 12 and the conductive elements 10v1 define a horn antenna 100. The widest portion (e.g., W1) of the conductive layers 11, 12 and the conductive element 10v1 define a radiation opening 11o of the horn antenna 100 to radiate or receive electromagnetic waves.

The conductive layer (or "the third conductive layer") 16 is disposed over the conductive layer 12 and separated from the conductive layer 12. The conductive layer 16 is disposed at a location corresponding to a portion of the conductive layer 12. The conductive layer 16 is disposed at a fourth layer of the substrate 10 that is separated from the second layer of the substrate 10. For example, the conductive layer 16 is disposed within the substrate 10 and adjacent to the top surface 101 of the substrate 10. In some embodiments, the conductive layer 16 can be disposed on the top surface 101 of the substrate 10. In some embodiments, the conductive layer 16 includes, for example, Au, Ag, Al, Cu, or an alloy thereof. In some embodiments, the conductive layer 16 may include a ground layer.

Figure 1B:
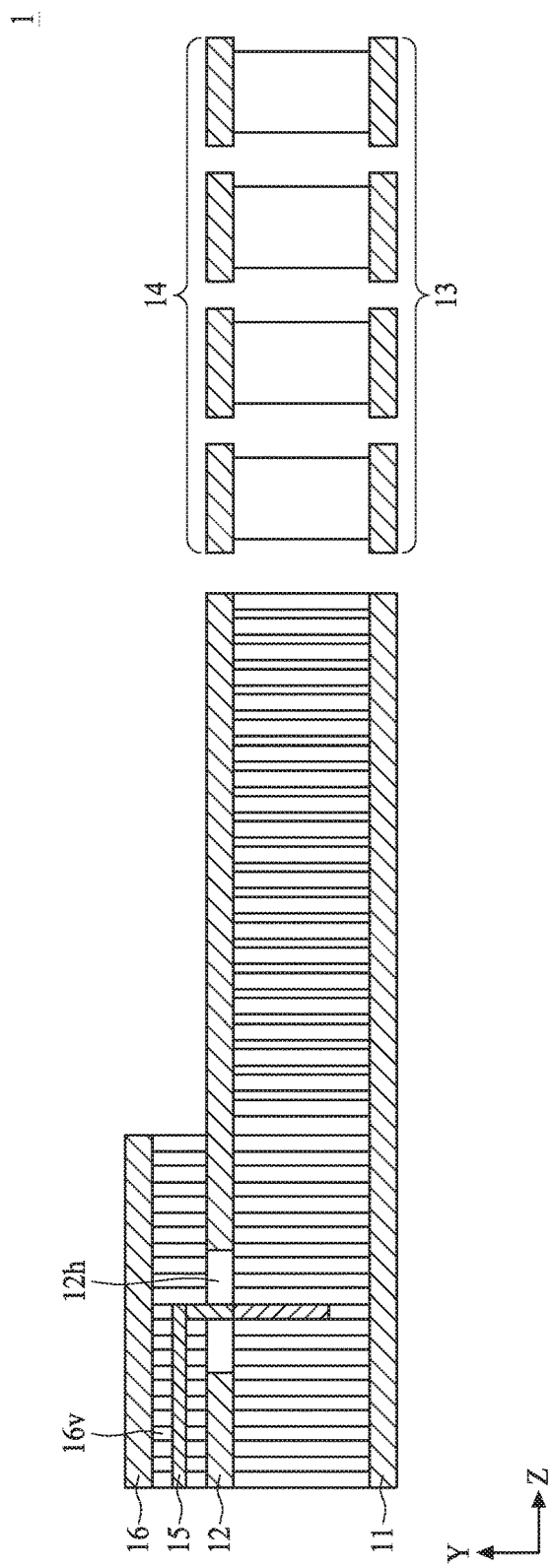
FIG. 1B illustrates a side view of a semiconductor package device in accordance with some embodiments of the present disclosure.

As shown in FIG. 1B, which illustrates a side view of the semiconductor package device 1 from the Y-Z plane shown FIG. 1A in accordance with some embodiments of the present disclosure, the conductive layers 12 and 16 can be electrically connected to each other through one or more conductive elements (e.g., one or more fourth conductive elements) 16v. In some embodiments, the conductive elements 16v may include conductive pillars or vias disposed along the edges of the conductive layer 16 and electrically connecting the conductive layer 16 with the conductive layer 12. There may be a gap between any two of the conductive pillars or vias (e.g., between any adjacent two of the conductive pillars or vias). In some embodiments, the conductive elements 16v may include a metal plate disposed along the edges of the conductive layer 16 and electrically connecting the conductive layer 16 with the conductive layer 12. In some embodiments, the conductive elements 16v may be disposed at any locations between the conductive layers 12 and 16 and electrically connect the conductive layer 16 with the conductive layer 12.

Figure 1C:
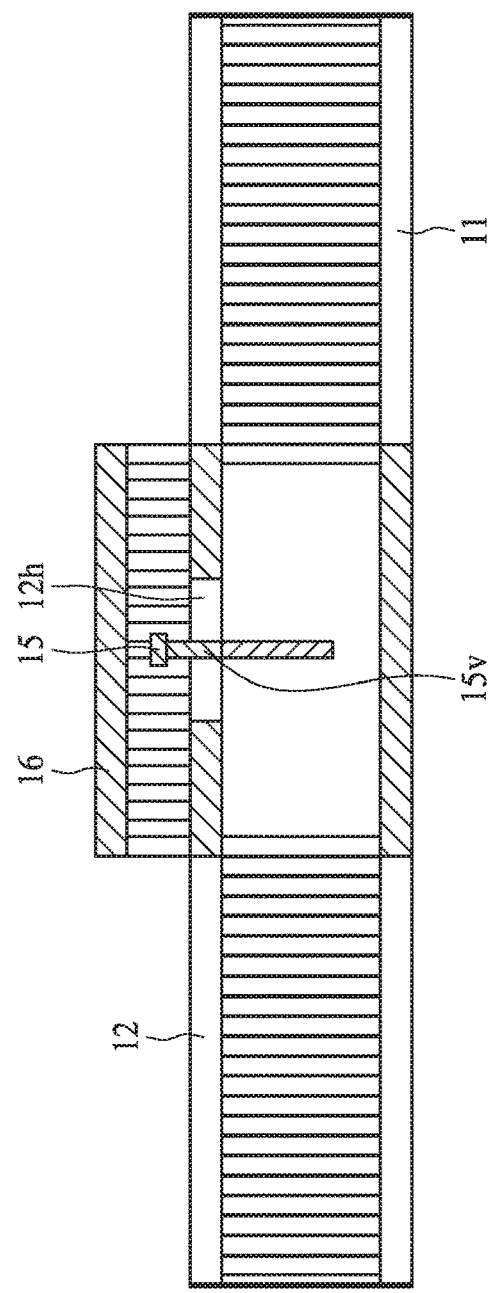
FIG. 1C illustrates a side view of a semiconductor package device in accordance with some embodiments of the present disclosure.

A feeding layer 15 is disposed between the conductive layers 12 and 16 and separated from the conductive layers 12 and 16. For example, the feeding layer 15 is disposed at a third layer of the substrate 10 that is separated from the second layer of the substrate 10. As shown in FIG. 1C, which illustrates a side view of the semiconductor package device 1 from the X-Y plane shown FIG. 1A in accordance with some embodiments of the present disclosure, the conductive layer 12 defines a hole 12h and includes a conductive element (e.g., a third conductive element) 15v connecting the feeding layer 15 to the waveguide cavity of the horn antenna 100 through the hole 12h of the conductive layer 12. In some embodiments, the conductive layer 16, the feeding layer 15 and the conductive elements 16v define a strip line structure of the horn antenna 100.

Referring to FIG. 1A, the director 13 is disposed adjacent to the conductive layer 11 and separated from the conductive layer 11 by a gap (e.g., a first gap) 13g1. In some embodiments, the director 13 is disposed at the same layer as the conductive layer 11. For example, the director 13 is disposed at the first layer of the substrate 10 or on the bottom surface 102 of the substrate 10. The director 13 includes one or more directing elements (e.g., one or more first directing elements) 13a, 13b, 13c and 13d. The directing elements 13a, 13b, 13c and 13d are disposed closely and separated from each other. The directing elements 13a, 13b, 13c and 13d are substantially parallel to each other. The number of the directing elements can be selected depending on different embodiments. For example, the director 13 may include N directing elements, wherein N is an integer larger or equal to 1. In some embodiments, the director 13 includes, for example, Au, Ag, Al, Cu, or an alloy thereof.

The director 14 is disposed adjacent to the conductive layer 12 and separated from the conductive layer 12 by a gap (e.g., a second gap) 14g1. In some embodiments, the director 14 is disposed at the same layer as the conductive layer 12. For example, the director 14 is disposed at the second layer of the substrate 10 or on the top surface 101 of the substrate 10. The director 14 includes one or more directing elements (e.g., one or more second directing elements) 14a, 14b, 14c and 14d. The directing elements 14a, 14b, 14c and 14d are disposed closely and separated from each other. The directing elements 14a, 14b, 14c and 14d are substantially parallel to each other. Each of the directing elements 14a, 14b, 14c and 14d is disposed corresponding to the directing elements 13a, 13b, 13c and 13d (e.g., to respective directing elements 13a, 13b, 13c, and 13d). The number of the directing elements can be selected depending on different embodiments. For example, the director 14 may include N directing elements, wherein N is an integer larger or equal to 1. In some embodiments, the director 14 includes, for example, Au, Ag, Al, Cu, or an alloy thereof. In some embodiments, a width of the radiation opening 11o is substantially the same as a width of one or more of the directing elements 13a, 13b, 13c, 13d, 14a, 14b, 14c, 14d. In some embodiments, there is a clear region relative to the directing elements 14a, 14b, 14c, 14d on the top surface 101 of the substrate 10, which is unoccupied by an electronic component.

The directors 13 and 14 can be electrically connected to each other through one or more conductive elements (e.g., one or more second conductive elements) 10v2. In some embodiments, the conductive elements 10v2 may include conductive pillars or vias disposed along the edges of the directors 13 and 14 and electrically connecting the director 13 with the director 14. In some embodiments, the conductive elements 10v2 may include a metal plate disposed along the edges of the directors 13 and 14 and electrically connecting the director 13 with the director 14. The conductive elements 10v2 are separated from each other. In some embodiments, a width W2 of the directors 13 and 14 is substantially the same as the width W1 of the widest portion of the conductive layers 11, 12. In some embodiments, there is a distance D1 between the lateral surface 105 of the substrate 10 and the directing element (e.g., the directing element 13d or 14d) that is closest to the lateral surface 105 of the substrate 10. In some embodiments, the distance D1 is in a range from about 3 millimeter (mm) to about 4 mm or in a range of about 1 mm or greater, or about 2 mm or greater, or about 3 mm or greater.

In comparison horn antennas without a director, the gain is about 2.4 decibels (dBi), which may provide a working range (e.g., transmission or detection range) up to about 0.17 meters (m). However, such working range is insufficient for some applications (such as a vehicle radar). In accordance with some embodiments, the horn antenna 100 includes directors 13 and 14 adjacent to the radiation opening 11o of the horn antenna 100. The directors 13 and 14 are beneficial to the resonance of the electromagnetic waves within the waveguide cavity of the horn antenna 100, which would increase the gain and the working range of the directors 13 and 14. In some embodiments, the gain of the horn antenna 100 (e.g., as shown in FIGS. 1A-1C) is about 3.5 to about 4 times as large as the gain of a horn antenna without directors, and the working distance of the horn antenna 100 (e.g., as shown in FIGS. 1A-1C) is about 5 times as large as the working distance of a horn antenna without directors.

In addition, in some embodiments, there is no distance between the lateral surface 105 of the substrate 10 and the directing element (e.g., the directing element 13d or 14d) that is closest to the lateral surface 105 of the substrate 10. Therefore, the radiation output of the horn antenna is at an interface or a boundary between the substrate 10 and another medium (e.g., air) external to the substrate 10, which may cause a transmission loss and decrease the gain or transmission quality of the horn antenna. In some embodiments (e.g., as shown in FIGS. 1A-1C), a distance (e.g., the distance D1) exists between the lateral surface 105 of the substrate 10 and the directing element (e.g., the directing element 13d or 14d) that is closest to the lateral surface 105 of the substrate 10, which may allow avoidance of transmission loss at the radiation output of the horn antenna 100 due to the interface or boundary between two different mediums (e.g., the substrate 10 and air).

Figure 2A:
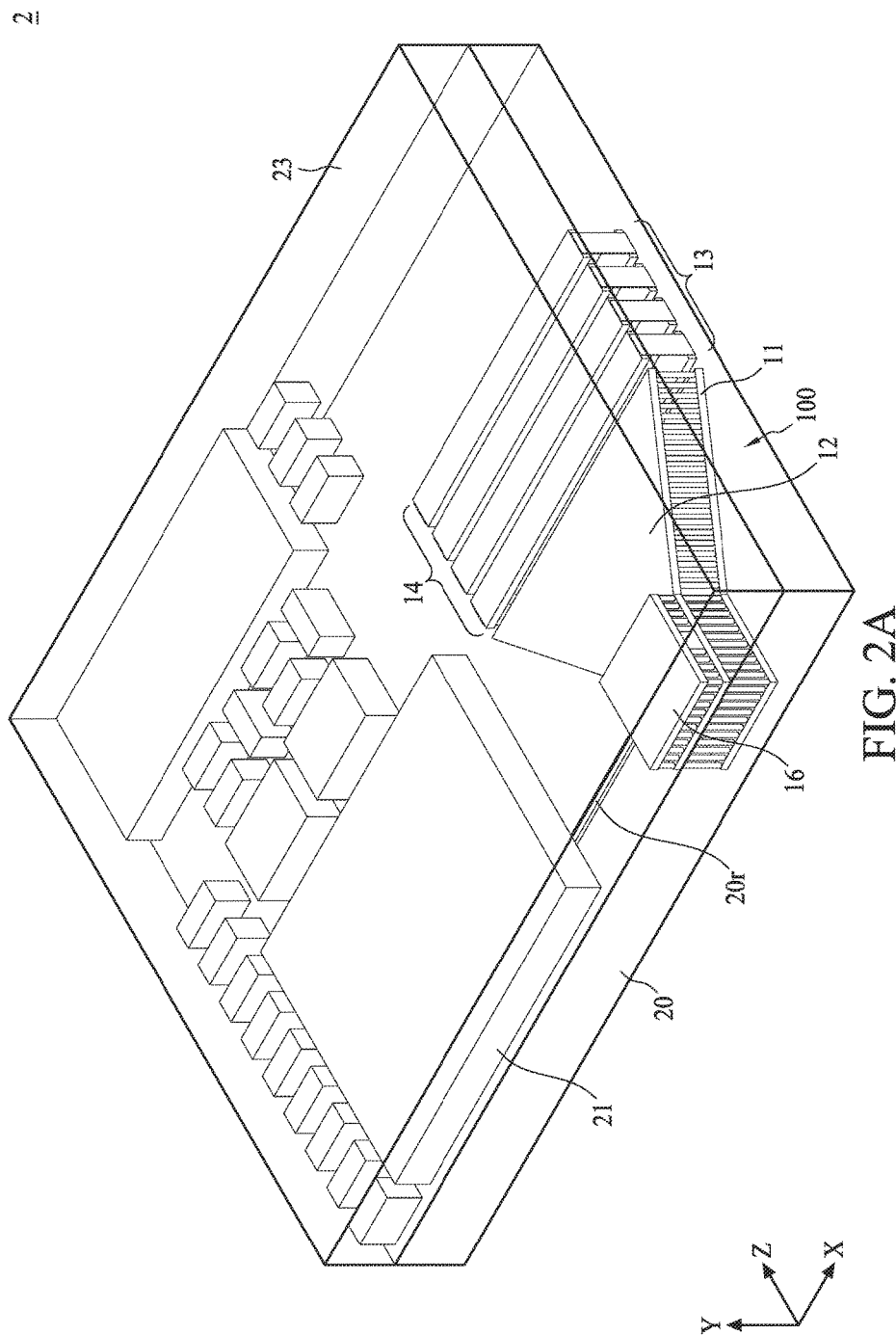
FIG. 2A illustrates a perspective view of a semiconductor package device in accordance with some embodiments of the present disclosure.

FIG. 2A illustrates a perspective view of a semiconductor package device 2 in accordance with some embodiments of the present disclosure. The semiconductor package device 2 includes a substrate 20, an electronic component 21, a horn antenna 100 and a package body (e.g., first package body) 23. In some embodiments, FIG. 2A illustrates the semiconductor package device 1 shown in FIG. 1A integrated with the electronic component 21.

The substrate 20 may include, for example, a printed circuit board, such as a paper-based copper foil laminate, a composite copper foil laminate, or a polymer-impregnated glass-fiber-based copper foil laminate. The substrate 20 may include an interconnection structure, such as an RDL or a grounding element. In some embodiments, the substrate 20 is the same as or similar to the substrate 10 as shown in FIG. 1A.

The electronic component 21 is disposed on a top surface of the substrate 20. The electronic component 21 may include an active component (such as an integrated circuit (IC) chip or a die), a passive electrical component (such as a capacitor, a resistor or an inductor) or a combination thereof. The electronic component 21 may be electrically connected to the antenna 100 and to the substrate 20 (e.g., to the RDL), and electrical connection may be attained by way of flip-chip or wire-bond techniques.

Figure 2B:
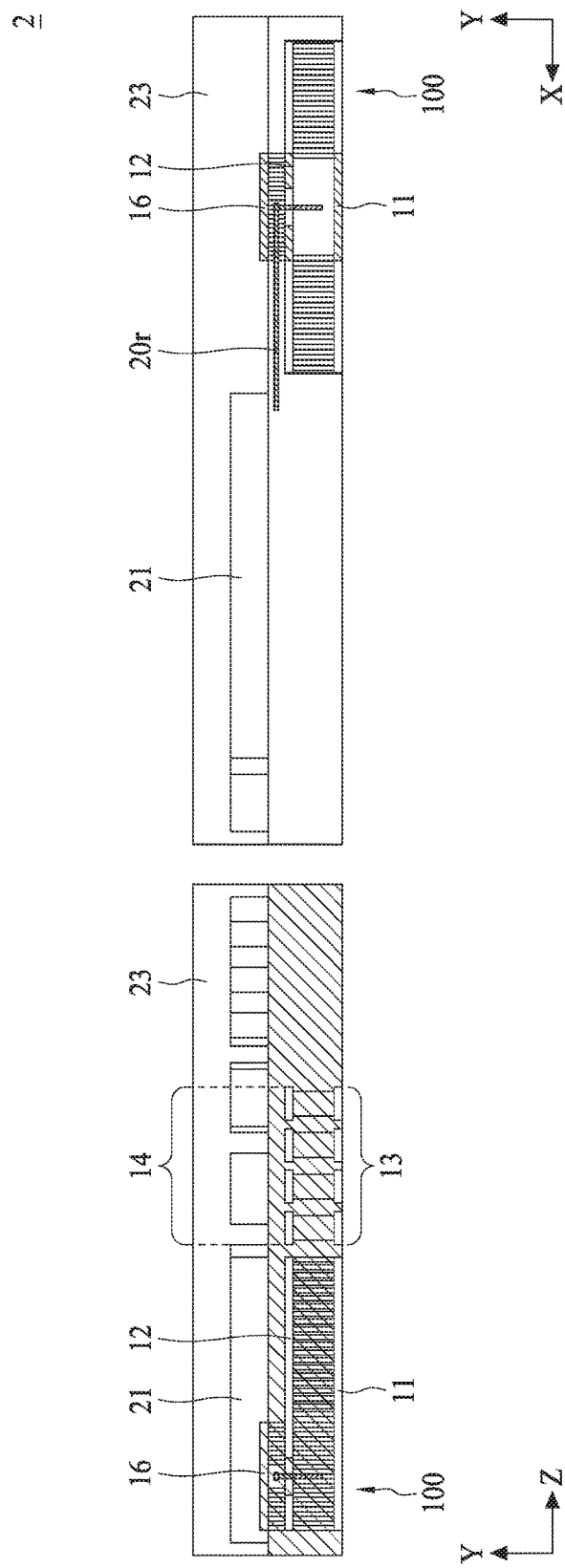
FIG. 2B illustrates a side view of a semiconductor package device in accordance with some embodiments of the present disclosure.

The horn antenna 100 is disposed adjacent to the electronic component 21. In some embodiments, the horn antenna 100 is the same as the horn antenna 100 as shown in FIGS. 1A-1C. In other embodiments, the horn antenna 100 may include any other suitable antennas. As shown in FIG. 2B, which illustrate side views of the semiconductor package device 2 from the Y-Z plane (the left drawing) and from the X-Y plane (the right drawing) shown FIG. 2A in accordance with some embodiments of the present disclosure, a portion of the horn antenna 100 is embedded within the substrate 20, and another portion of the horn antenna 100 is exposed from the substrate 20. For example, the conductive layers 11, 12, the feeding layer 15 and the directors 13, 14 are embedded within the substrate 20, and the conductive layer 16 of the horn antenna 100 is exposed from the substrate 20. The conductive layer 16 of the horn antenna 100 is disposed on the top surface of the substrate 20. The feeding layer 15 of the horn antenna 100 is electrically connected to the electronic component 21 through an interconnection structure (or electrical connection) 20r (e.g., an RDL).

The package body 23 is disposed on the top surface of the substrate 20 to cover or encapsulate the electronic component 21 and the conductive layer 16 of the horn antenna 100. In some embodiments, the package body 23 includes an epoxy resin including fillers, a molding compound (e.g., an epoxy molding compound or other molding compound), a polyimide, a phenolic compound or material, a material including a silicone dispersed therein, or a combination thereof.

Figure 3A:
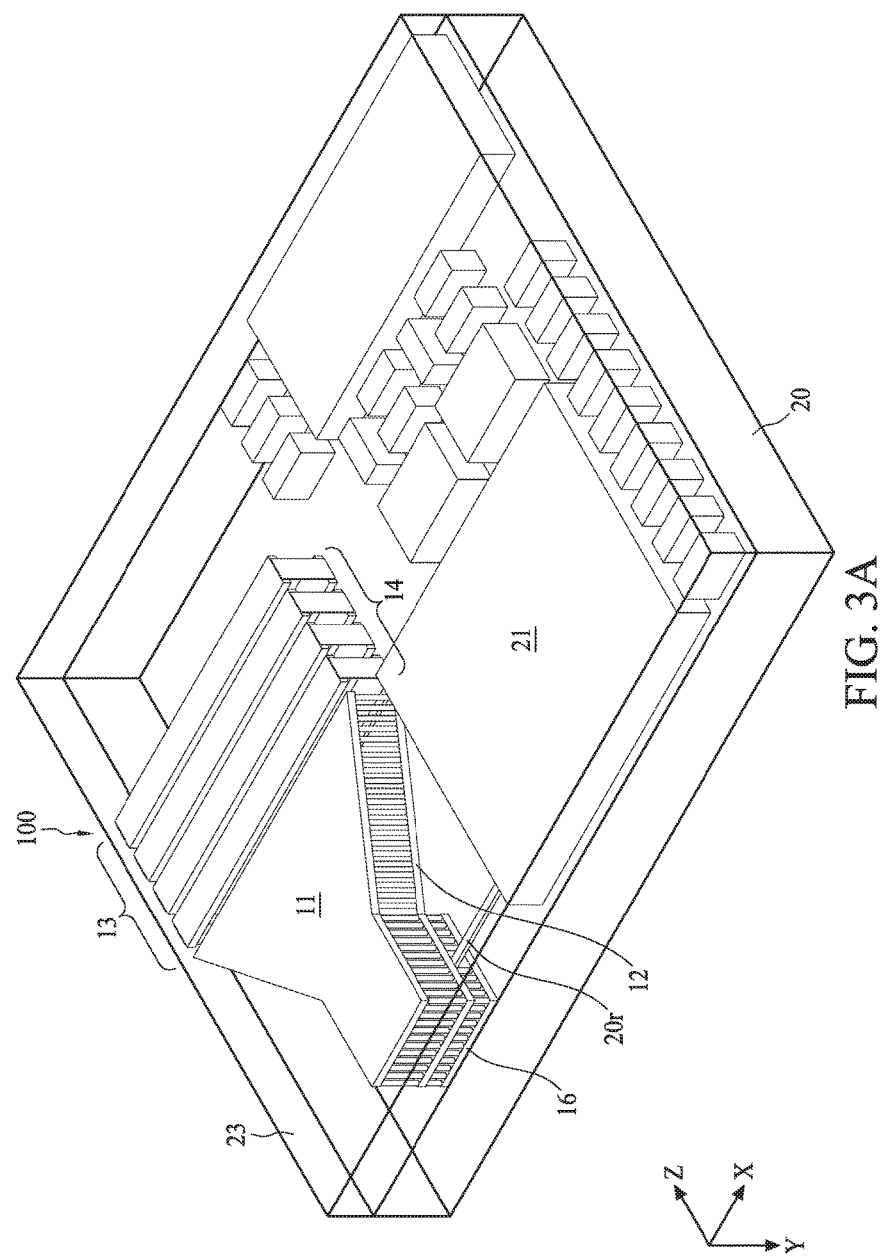
FIG. 3A illustrates a perspective view of a semiconductor package device in accordance with some embodiments of the present disclosure.

FIG. 3A illustrates a perspective view of a semiconductor package device 3 in accordance with some embodiments of the present disclosure. The semiconductor package device 3 is similar to the semiconductor package device 2 shown in FIG. 2A except that the horn antenna 100 in FIG. 3A is located at an opposite end of the semiconductor package device 3.

Figure 3B:
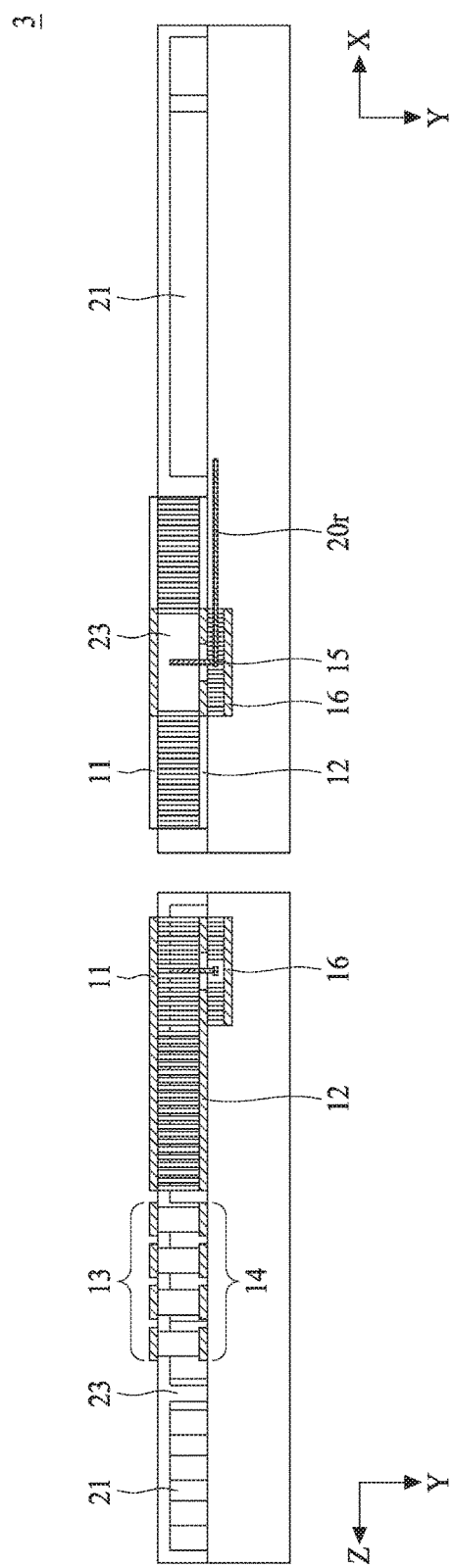
FIG. 3B illustrates a side view of a semiconductor package device in accordance with some embodiments of the present disclosure.

As shown in FIG. 3B, which illustrates side views of the semiconductor package device 3 from the Y-Z plane (the left drawing) and from the X-Y plane (the right drawing) shown FIG. 3A in accordance with some embodiments of the present disclosure, the conductive layer 11 and the director 13 are disposed on the top surface of the package body 23, the conductive layer 12 and the director 14 are disposed on the top surface of the substrate 20, and the feeding layer 15 and the conductive layer 16 is disposed within the substrate 20. The feeding layer 15 of the horn antenna 100 is electrically connected to the electronic component 21 through the interconnection structure 20r (e.g., the RDL).

Figure 4A:
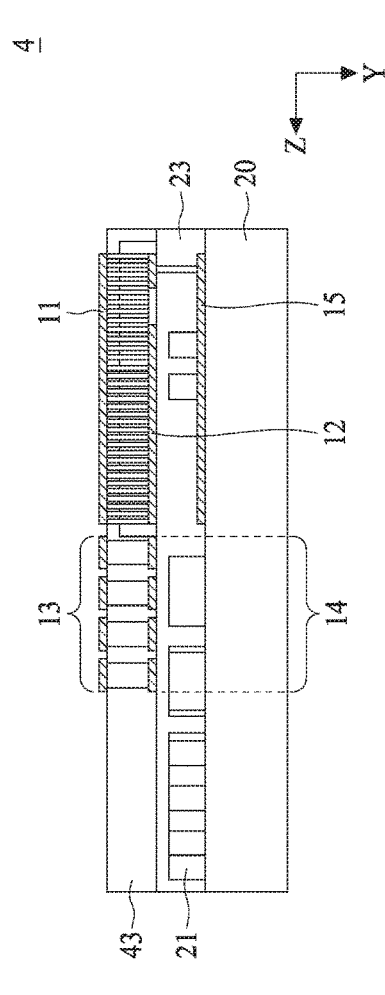
FIG. 4A illustrates a side view of a semiconductor package device in accordance with some embodiments of the present disclosure.

FIG. 4A illustrates a side view of a semiconductor package device 4 in accordance with some embodiments of the present disclosure. The semiconductor package device 4 is similar to the semiconductor package device 3 shown in FIG. 3B except that the semiconductor package device 4 further includes a package body (e.g., second package body) 43.

As shown in FIG. 4A, the conductive layer 11 and the director 13 are disposed on the package body 43, the conductive layer 12 and the director 14 are disposed on the package body 23 and the feeding layer 15 is disposed on the top surface of the substrate 20. The feeding layer 15 of the horn antenna 100 is electrically connected to the electronic component 21 through an interconnection structure (e.g., the RDL) (e.g., similar to that shown in FIG. 3B). In some embodiments, the semiconductor package device 4 may further include a conductive layer 16 within the substrate 20 (e.g., similar to that shown in FIG. 3B).

Figure 4B:
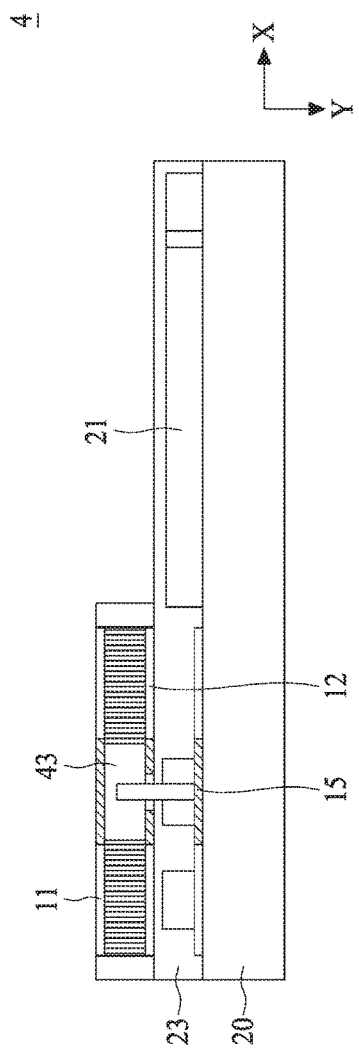
FIG. 4B illustrates a side view of a semiconductor package device in accordance with some embodiments of the present disclosure.

FIG. 4B is another side view of the semiconductor package device 4 in accordance with some embodiments of the present disclosure. As show in FIG. 4B, the package body 43 is selectively disposed on a portion of the package body 23 where the horn antenna 100 is located. In some embodiments, the package body 43 can be formed by, for example, a selective molding technique or other suitable techniques.

Figure 5B:
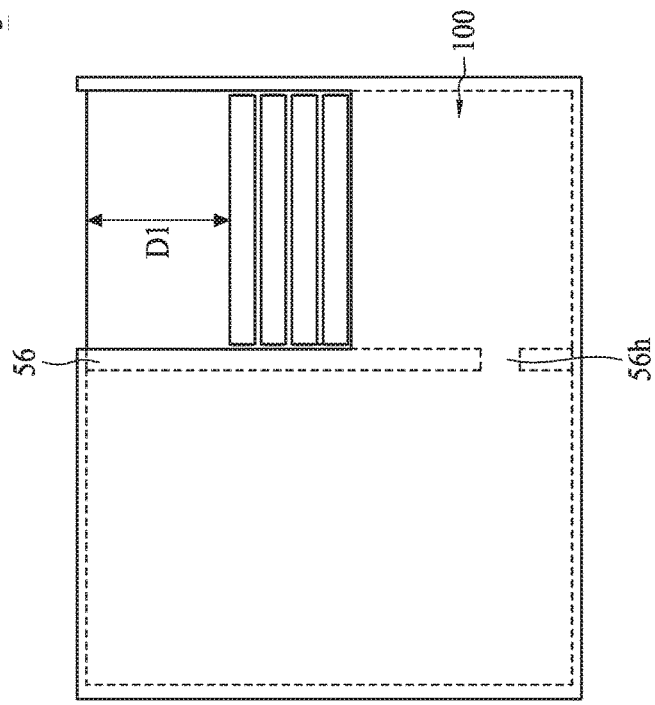
FIG. 5B illustrates a top view of a semiconductor package device in accordance with some embodiments of the present disclosure.
Figure 5A:
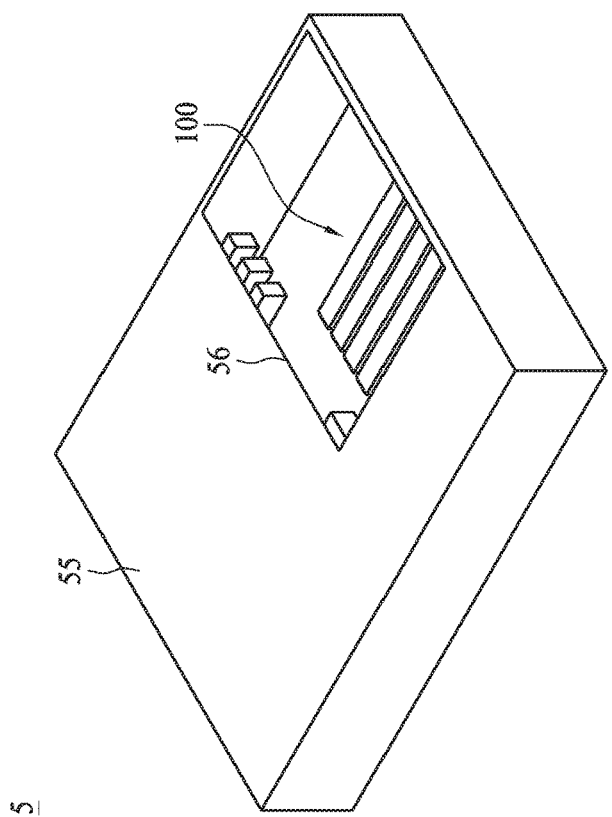
FIG. 5A illustrates a perspective view of a semiconductor package device in accordance with some embodiments of the present disclosure.

FIG. 5A illustrates a perspective view of a semiconductor package device 5 in accordance with some embodiments of the present disclosure. The semiconductor package device 5 is similar to the semiconductor package device 2 shown in FIG. 2A except that the semiconductor package device 5 further includes a conformal shield 55 and a compartment shield 56.

The conformal shield 55 is disposed to cover a portion of the package body 23 and substrate 20, and to expose another portion of the package body 23 and the substrate 20 where the horn antenna 100 is located. In some embodiments, the conformal shield 55 may cover a portion of the horn antenna 100 and expose the directors 13, 14 of the horn antenna 100. The conformal shield 55 is electrically connected to the grounding element of the substrate 20. In some embodiments, the conformal shield 55 is a conductive thin film, and may include, for example, Al, Cu, chromium (Cr), tin (Sn), Au, Ag, nickel (Ni) or stainless steel, or a mixture, an alloy, or other combination thereof. The conformal shield 55 may include a single conductive layer or multiple conductive layers. In some embodiments, the conformal shield 55 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the conformal shield 55 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, the conformal shield 55 includes multiple conductive layers, and different conductive layers may have different thicknesses.

FIG. 5B illustrates a top view of the semiconductor package device 5 as shown in FIG. 5A in accordance with some embodiments of the present disclosure. As shown in FIG. 5B, the compartment shield 56 is disposed between the electronic component 21 and the horn antenna 100 to prevent or reduce electromagnetic interference (e.g., crosstalk) between the electronic component 21 and the horn antenna 100. In some embodiments, the compartment shield 56 has or defines an opening 56h to allow electrical connections between the electronic component 21 and the horn antenna 100.

Figure 6B:
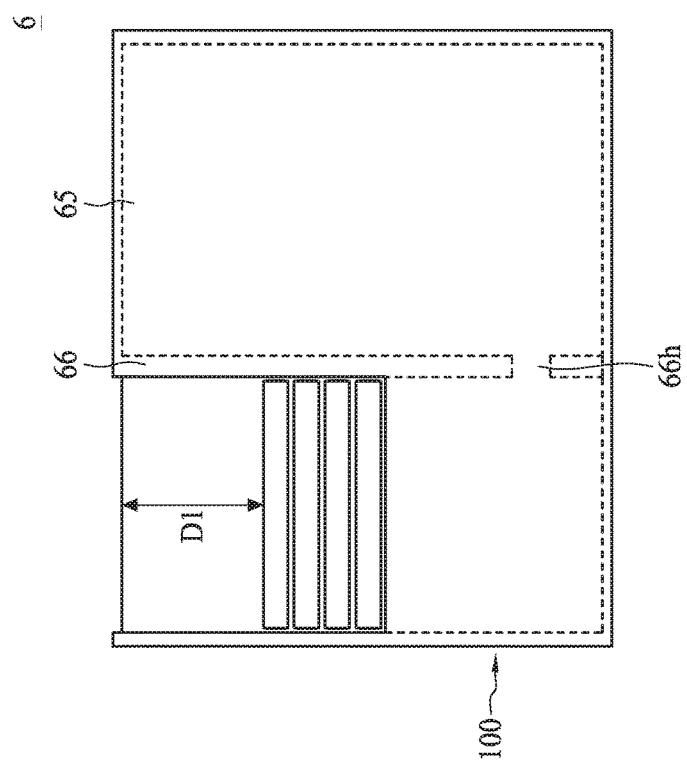
FIG. 6B illustrates a top view of a semiconductor package device in accordance with some embodiments of the present disclosure.
Figure 6A:
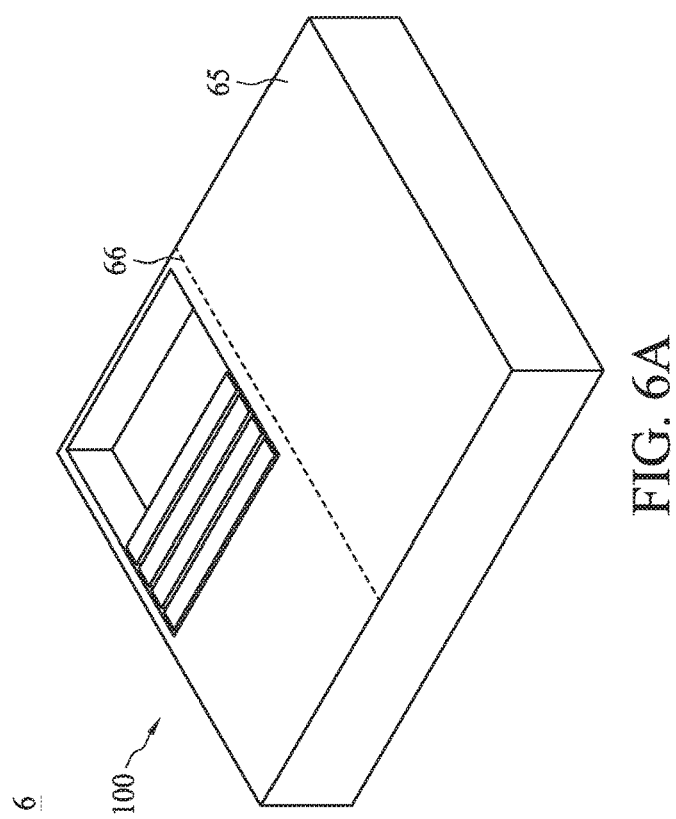
FIG. 6A illustrates a perspective view of a semiconductor package device in accordance with some embodiments of the present disclosure.

FIG. 6A illustrates a perspective view of the semiconductor package device 6 in accordance with some embodiments of the present disclosure. The semiconductor package device 6 is similar to the semiconductor package device 3 shown in FIG. 3A or the semiconductor package device 4 shown in FIG. 4A except that the semiconductor package device 6 further includes a conformal shield 65 and a compartment shield 66.

The conformal shield 65 is disposed to cover a portion of the package body 23 and substrate 20, and to expose another portion of the package body 23 and the substrate 20 where the horn antenna 100 is located. In some embodiments, the conformal shield 65 may cover a portion of the horn antenna 100 and expose the directors 13, 14 of the horn antenna 100. The conformal shield 65 is electrically connected to the grounding element of the substrate 20. In some embodiments, the conformal shield 65 is a conductive thin film, and may include, for example, Al, Cu, Cr, Sn, Au, Ag, Ni or stainless steel, or a mixture, an alloy, or other combination thereof. The conformal shield 65 may include a single conductive layer or multiple conductive layers. In some embodiments, the conformal shield 65 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the conformal shield 65 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, the conformal shield 65 includes multiple conductive layers, and different conductive layers may have different thicknesses.

FIG. 6B illustrates a top view of the semiconductor package device 6 as shown in FIG. 6A in accordance with some embodiments of the present disclosure. As shown in FIG. 6B, the compartment shield 66 is disposed between the electronic component 21 and the horn antenna 100 to prevent or reduce electromagnetic interference (e.g., crosstalk) between the electronic component 21 and the horn antenna 100. In some embodiments, the compartment shield 66 has or defines an opening 66h to allow electrical connections between the electronic component 21 and the horn antenna 100.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. Such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An antenna semiconductor package device, comprising:
   a first conductive layer;
   a second conductive layer over the first conductive layer and separated from the first conductive layer;
   a first conductive element connecting the first conductive layer to the second conductive layer; and
   a first directing element adjacent to the first conductive layer and separated from the first conductive layer by a first gap,
   wherein the first conductive element, the first conductive layer and the second conductive layer define a waveguide cavity and a radiation opening, and
   wherein the first directing element is outside of the waveguide cavity.

2. The semiconductor package device of claim 1, further comprising a second directing element adjacent to the second conductive layer and separated from the second conductive layer by a second gap.

3. The semiconductor package device of claim 2, further comprising:
   a plurality of first directing elements adjacent to the first directing element and separated from the first directing element, wherein any two of the plurality of first directing elements are separated from each other; and
   a plurality of second directing elements disposed adjacent to the second directing element and separated from the second directing element, wherein any two of the plurality of second directing elements are separated from each other.

4. The semiconductor package device of claim 3, wherein the first directing element is substantially parallel to any one of the plurality of first directing elements, and the second directing element is substantially parallel to any one of the plurality of second directing elements.

5. The semiconductor package device of claim 2, wherein the second directing element is located corresponding to the first directing element.

6. The semiconductor package device of claim 2, further comprising a second conductive element electrically connecting an edge of the second directing element to an edge of the first directing element.

7. The semiconductor package device of claim 2, wherein a width of the radiation opening is substantially the same as a width of the second directing element.

8. The semiconductor package device of claim 2, further comprising:
   a feeding layer disposed over the second conductive layer and separated from the second conductive layer; and
   a third conductive element connecting the feeding layer and extending from the feeding layer to the waveguide cavity and passing through the second conductive layer.

9. The semiconductor package device of claim 8, wherein the third conductive element passes through an opening defined by the second conductive layer.

10. The semiconductor package device of claim 9, further comprising a third conductive layer disposed over the feeding layer and separated from the feeding layer, wherein the third conductive layer is electrically connected to the second conductive layer by a fourth conductive element.

11. The semiconductor package device of claim 10, further comprising a substrate, wherein:
the first conductive layer is located at a first layer of the substrate,
the second conductive layer is located at a second layer of the substrate,
the feeding layer is located at a third layer of the substrate, and
the third conductive layer is located at a top surface of the substrate.

12. The semiconductor package device of claim 11, wherein the first directing element is located at the first layer of the substrate, and the second directing element is located at the second layer of the substrate.

13. The semiconductor package device of claim 11, wherein there is a clear region relative to the second directing element on the top surface of the substrate.

14. The semiconductor package device of claim 11, wherein the substrate has a first lateral surface and a second lateral surface substantially perpendicular to the first lateral surface, and there is a distance between the first directing element and the second lateral surface.

15. The semiconductor package device of claim 11, further comprising an electronic component disposed on the top surface of the substrate, wherein the substrate comprises an electrical connection within the substrate, and the electronic component is electrically connected to the feeding layer through the electrical connection within the substrate.

16. The semiconductor package device of claim 15, further comprising a package body disposed on the top surface of the substrate and encapsulating the electronic component and the third conductive layer.

17. The semiconductor package device of claim 10, further comprising:
a substrate;
an electronic component disposed on the substrate; and
a package body disposed on the substrate and encapsulating the electronic component, wherein:
the first conductive layer is located on the package body,
the second conductive layer is located on the substrate, and
the feeding layer and the third conductive layer are located at different layers of the substrate.

18. The semiconductor package device of claim 17, wherein the substrate comprises an electrical connection within the substrate, and the electronic component is electrically connected to the feeding layer through the electrical connection within the substrate.

19. The semiconductor package device of claim 10, further comprising:
a substrate;
an electronic component disposed on the substrate;
a first package body disposed on the substrate and encapsulating the electronic component; and
a second package body disposed on the first package body, wherein:
the first conductive layer is located on the second package body,
the second conductive layer is located on the first package body,
the feeding layer is located on the substrate, and
the third conductive layer is located within the substrate.

20. The semiconductor package device of claim 19, wherein the electronic component is electrically connected to the feeding layer.

21. The semiconductor package device of claim 1, wherein a width of the radiation opening is substantially the same as a width of the first directing element.

22. The semiconductor package device of claim 1, wherein the first directing element is coplanar with the first conductive layer.

* * * * *